United States Patent
Kang

(10) Patent No.: US 9,327,310 B2
(45) Date of Patent: May 3, 2016

(54) TENSIONING APPARATUS FOR MASK, MASK SHEET, AND MANUFACTURING SYSTEM FOR MASK

(71) Applicant: Samsung Display Co., Ltd., Yongin-si, Gyeonggi-do (KR)

(72) Inventor: Taek Kyo Kang, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 261 days.

(21) Appl. No.: 13/688,055

(22) Filed: Nov. 28, 2012

(65) Prior Publication Data

US 2013/0318774 A1    Dec. 5, 2013

(30) Foreign Application Priority Data

May 31, 2012    (KR) .................. 10-2012-0058417

(51) Int. Cl.
    *C23C 14/04*      (2006.01)
    *B05C 21/00*      (2006.01)
    *H01L 51/56*      (2006.01)

(52) U.S. Cl.
    CPC ............. *B05C 21/005* (2013.01); *C23C 14/042* (2013.01); *H01L 51/56* (2013.01); *Y10T 29/49* (2015.01)

(58) Field of Classification Search
    CPC .... B05C 21/005; C23C 14/042; Y10T 29/49; H01L 51/56
    USPC ................. 29/896.6, 559; 72/351; 445/47, 58
    See application file for complete search history.

(56) References Cited

U.S. PATENT DOCUMENTS 3,296,850 A *    1/1967    Fiore .............................. 72/351

FOREIGN PATENT DOCUMENTS

| JP | 2003-109499 A | 4/2003 |
|---|---|---|
| JP | 2005-353510 A | 12/2005 |
| JP | 2006-169587 A | 6/2006 |
| KR | 10-1999-0048623 A | 7/1999 |
| KR | 10-2001-0021427 A | 3/2001 |
| KR | 10-2003-0084556 A | 11/2003 |
| KR | 10-2004-0075285 A | 8/2004 |

\* cited by examiner

*Primary Examiner* — Richard Chang
(74) *Attorney, Agent, or Firm* — Knobbe, Martens, Olson & Bear, LLP

(57) ABSTRACT

A mask tensioning apparatus is disclosed. In one embodiment, the mask tensioning apparatus includes: i) a clamp supporting a mask sheet disposed on the mask frame to couple the mask sheet to the mask frame and ii) a tensioner connected to the clamp and applying a tensioning force to the clamp to fix the mask sheet fixed by the clamp to the mask. The clamp may be arranged in a substantially vertical or oblique direction with regard to the elongation direction of the mask sheet, thereby supporting the mask sheet.

19 Claims, 5 Drawing Sheets

TENSIONING APPARATUS FOR MASK, MASK SHEET, AND MANUFACTURING SYSTEM FOR MASK

RELATED APPLICATIONS

This application claims priority to and the benefit of Korean Patent Application No. 10-2012-0058417 filed in the Korean Intellectual Property Office on May 31, 2012, the entire contents of which are incorporated herein by reference.

BACKGROUND

1. Field

The described technology generally relates to a mask manufacturing system.

2. Description of the Related Technology

An organic light emitting diode (OLED) display generally includes two electrodes and an organic emission layer disposed therebetween, and electrons injected from one electrode and holes injected from the other electrode are coupled with each other on the organic emission layer to form excitons and the excitons emit light while emitting energy.

SUMMARY

One inventive aspect is a mask tensioning apparatus of a deposition mask used in the manufacture of an organic light emitting diode (OLED) display, a mask sheet, and a mask manufacturing system including the same.

Another aspect is a mask tensioning apparatus that saves installation space of a clamp and tensioning force application means for tensioning a mask sheet, a mask sheet, and a mask manufacturing system including the same.

Another aspect is a mask tensioning apparatus that easily combines a mask sheet on a mask frame including a plurality of openings, a mask sheet, and a mask manufacturing system including the same.

Another aspect is a mask tensioning apparatus which includes: a clamp supporting a mask sheet disposed on a mask frame to couple the mask sheet to the mask frame; and a tensioning means connected to the clamp and applying a tensioning force to the clamp to fix the mask sheet fixed by the clamp to the mask, wherein the clamp is arranged in a vertical or oblique direction with regard to the elongation direction of the mask sheet thereby supporting the mask sheet.

The clamp may be clamped to a protruding portion formed at an end portion of the mask sheet.

The protruding portion of the mask sheet may be formed at four edges of the mask sheet.

The tensioning means may apply the tensioning force to the mask sheet in the elongation direction of the mask sheet and may apply the tensioning force to the mask sheet in the vertical or oblique direction with regard to the elongation direction of the mask sheet.

A pressing member pressing the mask sheet in a side of the mask frame may be further included.

The pressing member may be formed as a pair to press both end portions of the mask sheet.

The pressing member may include a block of which a pressing surface pressing the mask sheet is formed of a rectangle shape or as a roller of which the pressing surface is formed of a curved surface.

Another aspect is a mask sheet for an organic light emitting diode (OLED) display, as a mask sheet weld-coupled on a mask frame for the OLED, which includes a protruding portion formed to be clamped to an end portion with a clamp.

The protruding portion may be formed at four edges of the mask sheet.

Another aspect is a mask manufacturing system which includes: a mask frame; a mask sheet disposed on the mask frame; a mask tensioning apparatus including a clamp supporting the mask sheet to couple the mask sheet to the mask frame and a tensioning means connected to the clamp and applying a tensioning force to the clamp to fix the mask sheet fixed by the clamp to the mask; and a coupling means coupling the mask sheet to the mask frame, wherein the clamp is arranged in a vertical or oblique direction with regard to the elongation direction of the mask sheet thereby supporting the mask sheet.

The clamp may be clamped to a protruding portion formed at an end portion of the mask sheet.

The protruding portion of the mask sheet may be formed at four edges of the mask sheet.

The tensioning means may apply the tensioning force to the mask sheet in the elongation direction of the mask sheet and may apply the tensioning force to the mask sheet in the vertical or oblique direction with regard to the elongation direction of the mask sheet.

A pressing member pressing the mask sheet in a side of the mask frame may be further included.

The pressing member may be formed as a pair to press both end portions of the mask sheet.

The pressing member may include a block of which a pressing surface pressing the mask sheet is formed of a rectangle shape or as a roller of which the pressing surface is formed of a curved surface.

The mask frame may include a pair of first frames parallel to each other, and two or more second frames coupled to the pair of first frames in a direction perpendicular to the first frames and arranged to be separated from each other.

A plurality of mask sheets may be coupled to one opening formed by a pair of first frames and two adjacent second frames of the mask frame.

The coupling means may be a welding apparatus for welding the mask sheet to the mask frame.

The mask manufacturing apparatus may be disposed for the clamp to clamp the mask sheet in the vertical or oblique direction with regard to the elongation direction of the mask sheet such that the installation space of the clamp and the tensioning means may be reduced without the arrangement of the clamp and the tensioning means parallel to the elongation direction of the mask sheet at both end portions of the mask frame.

The mask manufacturing apparatus may tension the mask sheet after clamping the mask sheet in the vertical or oblique direction with regard to the elongation direction of the mask sheet by the clamp such that the clamping and the tensioning of the mask sheet may be performed without interference to the mask frame even though a plurality of openings coupled with the divided mask sheets are formed as the size of the mask frame is increased.

DETAILED DESCRIPTION

Figure 1:
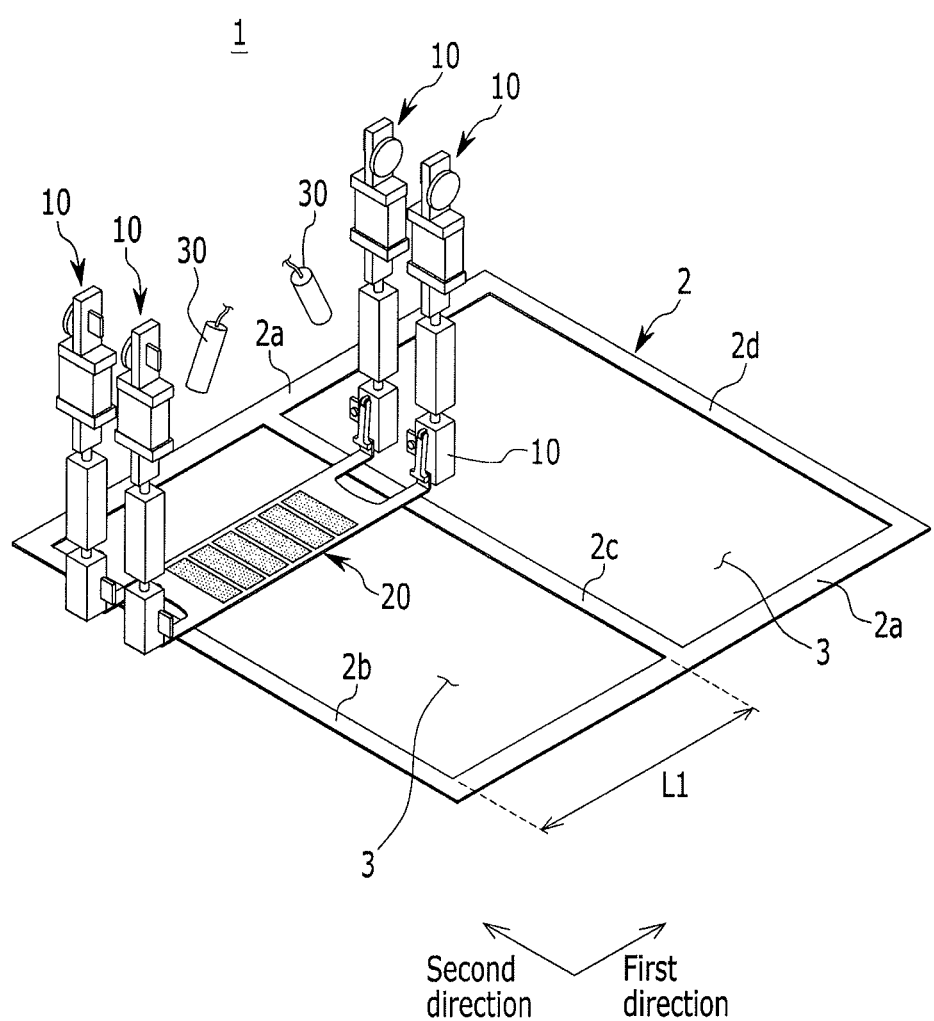
FIG. 1 is a perspective view of a mask manufacturing system according to a first embodiment.

Generally, to form an organic emission layer, an organic material is deposited on a substrate, and to achieve this, a deposition source filled with the organic material is heated to evaporate the organic material and spray the same over the substrate. In this instance, to deposit the evaporated and sprayed organic material with a specific pattern, an opening is formed on a specific position to deposit it, and a deposition mask made of a metallic material is used for a remaining position. A deposition mask can be classified as either a divided mask or a non-divided mask according to the manufacturing method. A non-divided mask is manufactured by pulling a mother mask that is not divided in four directions by using clamps that are installed at four corners of the mask manufacturing device to apply tension to the mother mask sheet, and welding it to the mask frame. A divided mask is manufactured by pulling both ends of a mask sheet that is divided per cell by using a clamp that is installed in both ends of a mask manufacturing device to apply a tension force to the mask sheet, and welding it to the mask frame.

The division method provides good selectivity and is easy to repair so it has been widely applied in mass production environments. However, the divided mask has tensioning force applied in an elongation direction at both ends of the mask sheet after both ends of the divided mask sheet have been clamped. Thus, the clamp and the tensioner are positioned at both sides of the mask frame and occupy significant space that is proportional to the size of a frame.

As the size of the frame has increased with time and because the mask frame combined with the divided mask sheet includes a plurality of openings, when a number of divided mask sheets are combined at each opening, and the clamp and tensioning force application are installed at both ends of the mask frame, it becomes more difficult to clamp the divided mask sheet.

Hereinafter, embodiments will be described in detail with reference to the accompanying drawings. As those skilled in the art would realize, the described embodiments may be modified in various different ways, all without departing from the spirit or scope of the present disclosure. The drawings and description are to be regarded as illustrative in nature and not restrictive. Like reference numerals designate like elements throughout the specification.

Figure 2:
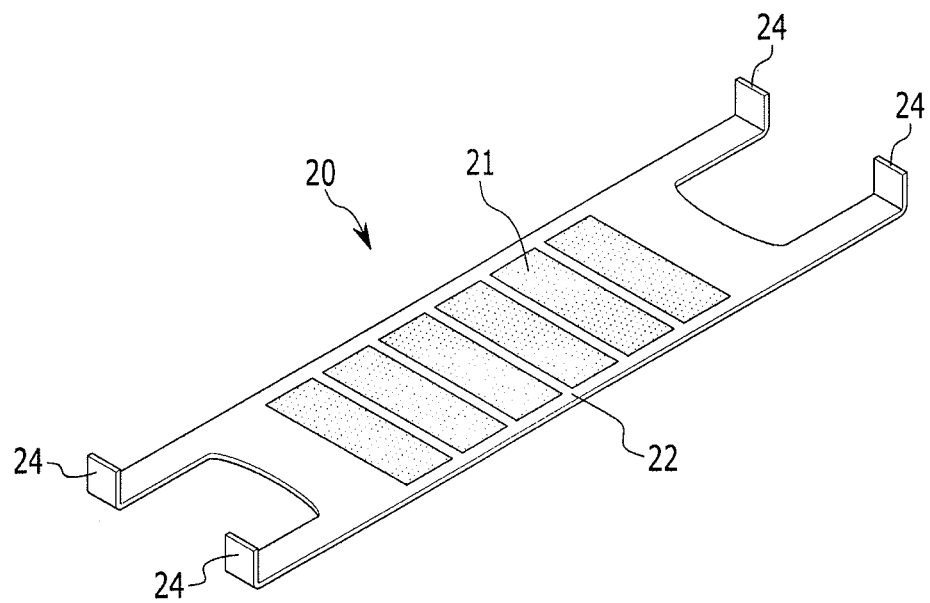
FIG. 2 is a perspective view of a mask sheet used in a mask manufacturing system according to the first embodiment.
Figure 3:
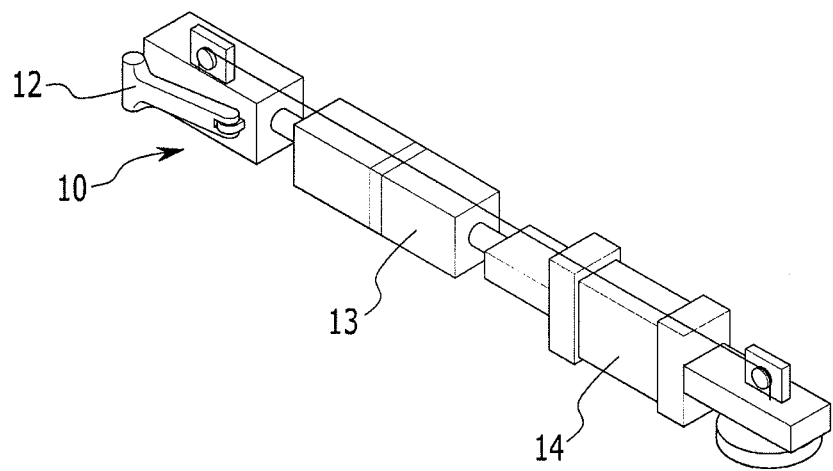
FIG. 3 is a perspective view of a mask tensioning apparatus of a mask manufacturing system according to the first embodiment.
Figure 4:
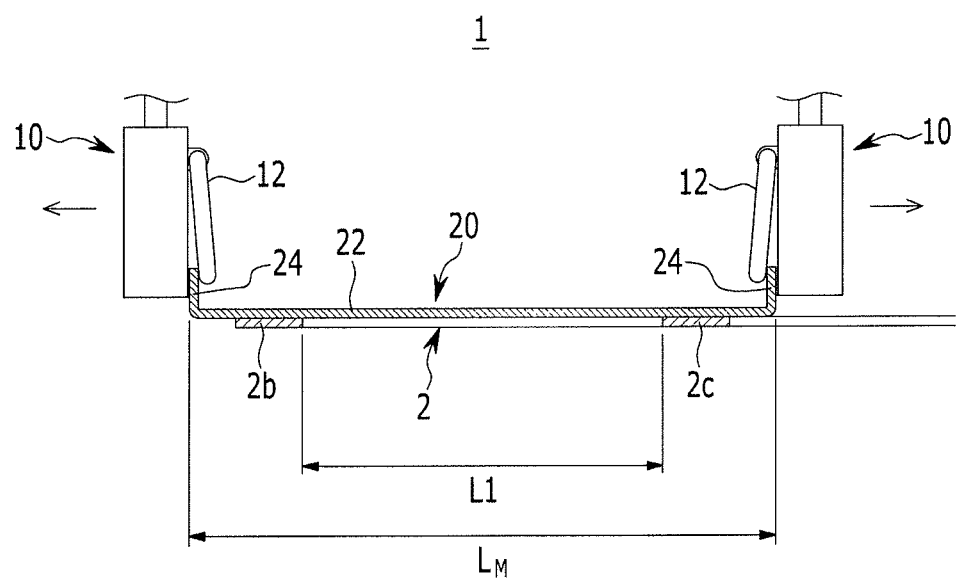
FIG. 4 is a cross-sectional view showing a state of a mask tensioning apparatus of a mask manufacturing system according to the first embodiment while tensioning a mask sheet.

FIG. 1 is a perspective view of a mask manufacturing system according to a first embodiment. FIG. 2 is a perspective view of a mask sheet used in a mask manufacturing system according to the first embodiment. FIG. 3 is a perspective view of a mask tensioning apparatus of a mask manufacturing system according to the first embodiment. FIG. 4 is a cross-sectional view showing a state of a mask tensioning apparatus of a mask manufacturing system according to the first embodiment while tensioning a mask sheet.

Referring to FIG. 1, a mask manufacturing system 1 includes a mask frame 2, a mask sheet 20, a mask tensioning apparatus 10, and a coupling means 30.

The mask frame 2 is a constituent element that is coupled with the mask sheet 20 to form a mask. As shown in FIG. 1, the mask frame 2 includes a pair of first frames 2a extending in a first direction and substantially parallel to each other, and at least two, for example, three second frames 2b, 2c, and 2d extending in a second direction substantially perpendicular to the first frames 2a to be coupled to the first frames and arranged to be separated from each other.

In this case, in one of openings 3 formed by a pair of first frames 2a and two second frames 2b and 2c adjacent to each other of mask frame 2, a plurality of mask sheets 20 may be coupled to be arranged in substantially parallel with the second direction as shown in FIG. 1. As described, the mask including a plurality of mask sheets 20 coupled to one opening 3 may be a divided mask.

Referring to FIG. 2, the mask sheet 20 coupled to the mask frame 2 includes a mask sheet body 22 having an opening 21 of a predetermined pattern, and protruding portions 24 protruded from both end portions of the mask sheet body 22.

The protruding portions 24 of the mask sheet 20 are formed to protrude in a direction substantially vertical to an elongation direction of the mask sheet body 22 at four edges of the mask sheet body 22. The protruding portion 24 may be formed of various shapes such as a thin plate shape to be coupled to a clamp.

In the present embodiment, the protruding portions 24 of the thin plate shape are formed to protrude at four edges of the mask sheet body 22 of a square shape, however the number and shape of the protruding portions formed at both end portions may be various in a case that the clamp is coupled to the protruding portion at both end portions of the mask sheet for tensioning the mask sheet.

To couple the mask sheet 20 of the above structure to the mask frame 2, the mask manufacturing system 1 includes the mask tensioning apparatus 10 and the coupler 30. The coupler 30 is used to couple the mask sheet 20 to the mask frame 2. The coupler 30 may be a welding apparatus.

In one embodiment, the mask sheet 20 is fixed on the mask frame 2 by using the mask tensioning apparatus 10, and a boundary region of the mask sheet 20 and the mask frame 2 are welded by using the welding apparatus to manufacture the mask.

Referring to FIG. 3, the mask tensioning apparatus 10 includes a clamp 12 and a tensioner 14.

The clamp 12 is a constituent element that is clamped to the protruding portion 24 of the mask sheet 20 for the mask sheet 20 to be coupled to the mask frame 2 to fix the mask sheet 20.

The tensioner 14 to apply the tensioning force to the clamp 12 is coupled at the rear side of the clamp 12. A tensioning force measurer 13 is installed between the clamp 12 and the tensioner 14 to measure the tensioning force applied to the clamp.

The mask manufacturing system 1 include four mask tensioning apparatuses 10, one for each clamp 12 to be respectively coupled to the protruding portions 24 formed at four edges of the mask sheet 20.

Meanwhile, for the mask manufacturing system 1, as shown in FIG. 4, the mask tensioning apparatus 10 is arranged in the direction substantially vertical to the elongation direction of the mask sheet 20 such that the clamp 12 of the mask tensioning apparatus 10 is coupled to the protruding portion 24 of the mask sheet 20.

As shown in FIG. 4, the mask tensioning apparatus 10 in which the clamp 12 is coupled to the protruding portion 24 of the mask sheet 20 is formed for the mask sheet 20 to be tensioned in the elongation direction of the mask sheet 20, that is, both side directions of the mask sheet 20.

As described, in the state in which the clamp 12 of the mask tensioning apparatus 10 clamps the protruding portion 24 of the mask sheet 20 in the substantially vertical direction, the tensioner of the mask tensioning apparatus 10 tensions the mask sheet 20 in the elongation direction of the mask sheet 20 to couple the mask sheet 20 to the mask frame.

Referring to FIG. 4, when a distance between two second frames 2b and 2c of the mask frame 2 is referred to as $L_1$, a length $L_M$ of the elongation direction of the mask sheet 20 is longer than $L_1$, thereby both end portions of the mask sheet 20 contact on two adjacent second frames 2b and 2c of the mask frame 2 in a state in which the mask sheet 20 is disposed on the two second frames 2b and 2c of the mask frame 2.

As described, in the state in which the mask sheet 20 contacts the mask frame 2, the welding apparatus bonds the contact portions of the mask sheet 20 and the mask frame 2 such that the mask sheet 20 is weld-bonded to the mask frame 2.

The mask tensioning apparatus 10 may be connected to a base (not shown) fixed with the mask frame 2 or may be separated from the base in which the mask frame 2 is installed.

In one embodiment, the mask tensioning apparatus 10 is arranged in the direction substantially vertical to the mask sheet 20 coupled to the mask frame 2 such that the mask tensioning apparatus 10 may be positioned on both end portions of the mask sheet 20 on the mask frame 2 to be clamped without being disposed at an outer portion of the second frame of the mask frame 2, that is, outside the second frames 2b and 2d in FIG. 1.

Accordingly, for the tensioning of the mask sheet by a comparative mask tensioning apparatus in both directions from both end portions of the mask frame, the comparative mask tensioning apparatus is installed at both sides of the mask frame such that the mask manufacturing system including the mask tensioning apparatus occupies the wide space, however the mask manufacturing system 1 according to an embodiment does not need to install the mask tensioning apparatus at both sides of the mask frame such that the installation space of the mask tensioning apparatus 10 may be saved.

Also, the mask tensioning apparatus 10 of the mask manufacturing system 1 according to an embodiment is clamped to the protruding portion 24 of the mask sheet 20 on the second frame 2c positioned at the center portion of the mask frame 2 including a plurality of openings for the tensioning of the mask sheet 20 such that the mask sheet 20 may be easily bonded to the openings of each mask frame 2 although the mask frame 2 has a plurality of openings.

Next, the mask manufacturing system according to another embodiment will be described with reference to accompanying drawings.

Figure 5:
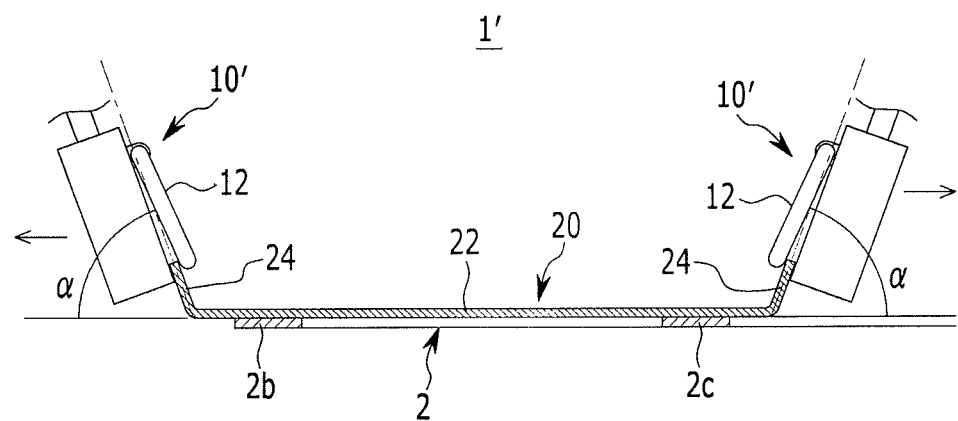
FIG. 5 is a cross-sectional view showing a state of a mask tensioning apparatus of a mask manufacturing system according to a second embodiment while tensioning a mask sheet.

FIG. 5 is a cross-sectional view showing a state of a mask tensioning apparatus of a mask manufacturing system 1' according to a second embodiment while tensioning a mask sheet.

In the description of the mask manufacturing system 1' according to the second embodiment, the detailed description of the same constituents as the first embodiment is omitted and the mask manufacturing system 1' according to the second embodiment is described while focusing on differences from the first embodiment.

Differently from the first embodiment, the mask manufacturing system 1' according to the second embodiment is formed for the mask tensioning apparatus 10' to tension the mask sheet 20 in an inclined direction for of the mask sheet, not the direction substantially vertical to the elongation direction of the mask sheet 20.

For this purpose, in the mask tensioning apparatus 10' of the mask manufacturing system 1' according to the second embodiment, a clamp 12 is arranged in the inclination direction at a predetermined angle ($\alpha$) with respect to the elongation direction of the mask sheet 20.

The mask tensioning apparatus 10' may be obliquely arranged with regard to the elongation direction of the mask sheet 20, or only the clamp 12 coupled to the protruding portion 24 of the mask sheet 20 may be obliquely arranged.

To easily couple the mask tensioning apparatus 10' in the inclination direction for the mask sheet 20, the protruding portion 24 of the mask sheet 20 may be obliquely formed with regard to the elongation direction of the mask sheet 20.

As described, when tensioning the mask sheet 20 in the state in which the mask tensioning apparatus 10' is arranged in the direction inclined with respect to the elongation direction of the mask sheet 20, the tensioning direction of the mask tensioning apparatus 10 may be a direction substantially parallel to the elongation direction of the mask sheet 20.

For the mask manufacturing system 1' of the second embodiment, while the mask tensioning apparatus 10' is obliquely coupled to the protruding portion 24 of the mask sheet 20 with respect to the elongation direction of the mask sheet 20 for the tensioning of the mask sheet 20, the welding apparatus welds the mask frame 2 and the contact portion of the mask sheet 20 to manufacture the mask.

At this time, the angle ($\alpha$) at which the mask tensioning apparatus 10' or the clamp 12 is inclined with respect to the elongation direction of the mask sheet 20 may be determined by considering the space occupied by the mask tensioning apparatus 10', the magnitude of the tensioning force tensioning the mask sheet 20, and the size of the mask tensioning apparatus 10'.

In the mask manufacturing system according to the second embodiment, the base structure and the number of mask tensioning apparatuses 10' is similar to the mask manufacturing system according to the first embodiment such that the detailed description thereof is omitted.

Figure 6:
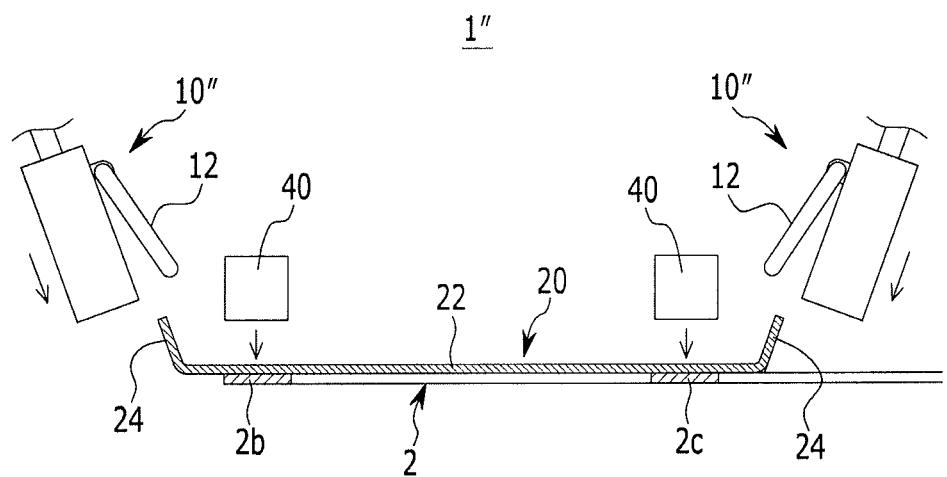
FIG. 6 is a cross-sectional view of a mask tensioning apparatus of a mask manufacturing system according to a third embodiment.
Figure 7:
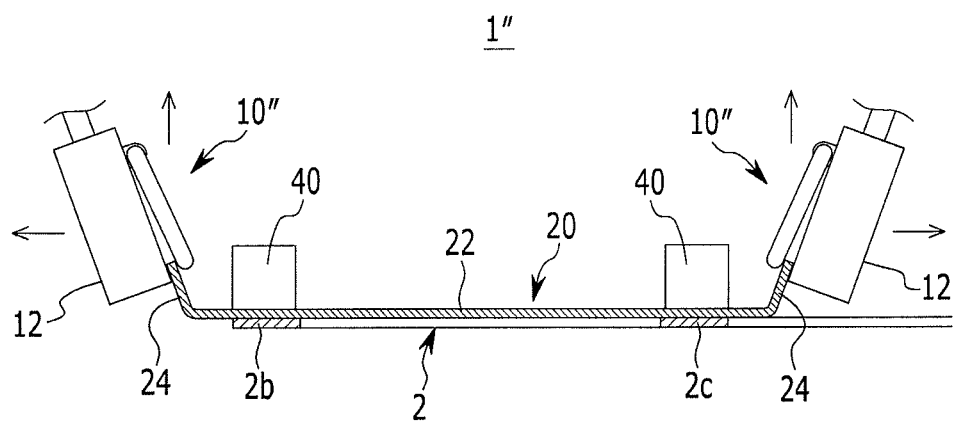
FIG. 7 is a cross-sectional view showing a state of a mask tensioning apparatus of a mask manufacturing system according to the third embodiment while tensioning a mask sheet.
Figure 8:
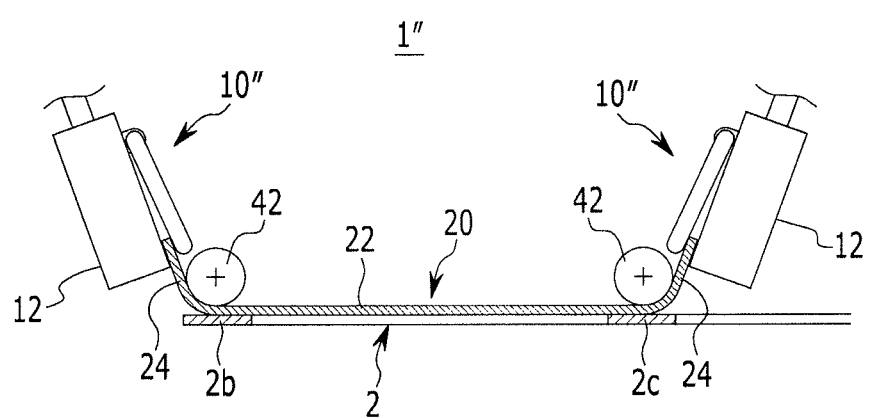
FIG. 8 is a cross-sectional view of a state in which a pressing member of a roller shape presses a mask sheet in a mask manufacturing system according to the third embodiment.

FIG. 6 is a cross-sectional view of a mask tensioning apparatus of a mask manufacturing system according to the third embodiment. FIG. 7 is a cross-sectional view showing a state of a mask tensioning apparatus of a mask manufacturing system according to the third embodiment while tensioning a mask sheet. FIG. 8 is a cross-sectional view of a state in which a pressing member of a roller shape presses a mask sheet in a mask manufacturing system according to the third embodiment.

In the description of the mask manufacturing system according to the third embodiment, the detailed description of the same constituents as the above described embodiments is omitted and the mask manufacturing system according to the third embodiment is described while focusing on differences from the above-described embodiments.

Referring to FIG. 6, the mask manufacturing system 1" according to the third embodiment includes a pressing member 40 added to the mask manufacturing system 1' according to the second embodiment.

The pressing member 40 is a member to press the mask sheet 20 in a side of the mask frame 2 in a state in which the mask sheet 20 contacts the mask frame 2.

The pressing member 40 may have a cross-section formed of a rectangular (or other polygonal) block shape as shown in FIG. 7 such that the surface contacts the mask sheet 20 as a plane, for example, a square plane shape, or as a friction roller 42 of which the pressing surface is formed of a curved surface as shown in FIG. 8.

At this time, the pressing member 40 is formed to be separated from the mask sheet 20 to not press the mask sheet 20 in a state that the mask sheet 20 is separated from the mask frame 2, as shown in FIG. 6.

As shown in FIG. 7, the pressing member is formed to press the upper portion of the second frames 2b and 2c at both end portions of the mask sheet 20 in the state that the mask tensioning apparatus 10" is coupled to the protruding portion 24 of the mask sheet 20.

As described, in the state that the pressing member 40 presses the mask sheet 20, the mask tensioning apparatus 10" tensions the mask sheet 20.

At this time, in the state that the pressing member 40 presses the mask sheet 20, the tensioning direction of the mask tensioning apparatus 10" may be the direction substantially parallel to the elongation direction of the mask sheet 20, the inclination direction of the mask sheet, or the direction substantially vertical to the elongation direction of the mask sheet.

In the state that the pressing member 40 does not press the mask sheet 20, when the mask tensioning apparatus 10" tension the mask sheet 20 in the direction substantially vertical to the elongation direction of the mask sheet 20, the mask sheet 20 may not contact with but is separated from the mask frame 2 such that the welding may be difficult.

Accordingly, as shown in the third embodiment, the mask sheet 20 is pressed by using the pressing member 40 such that the mask sheet 20 may further easily contact the mask frame 2.

At this time, the size and the shape of the pressing member 40 pressing the mask sheet 20 and the pressing degree may be appropriately selected by considering the welding position of the mask sheet.

In the mask manufacturing system according to the various embodiments, the mask tensioning apparatus including the clamp is moved in the direction except for the direction substantially parallel to the elongation direction of the mask sheet for the tensioning of the mask such that the tensioning of the divided mask is possible without the influence of the position of the mask frame installed with the mask sheet.

Accordingly, in the case of this tensioning, although the mask of the large size including a plurality of panels like 8G is manufactured, it is not necessary to increase the size of the mask sheet to the entire region of the 8G panel, and the control of the mask sheet is easy when manufacturing and repairing the mask.

While the above embodiments have been described with reference to the accompanying drawings, it is to be understood that the present disclosure is not limited to the disclosed embodiments, but, on the contrary, is intended to cover various modifications and equivalent arrangements included within the spirit and scope of the appended claims.

What is claimed is:

1. A mask tensioning apparatus comprising:
   at least two clamps configured to support a mask sheet placed on a mask frame to couple the mask sheet to the mask frame, wherein the mask sheet has a length and a width less than the length, and wherein the mask sheet has i) a linear middle portion and ii) first and second ends opposing each other and extending from the middle portion at an angle; and
   at least two tensioners configured to apply a tensioning force to the clamps to fix the mask sheet and apply the tensioning force to the mask sheet in the length direction of the mask sheet, each tensioner connecting to each clamp,
   wherein the clamps are arranged in a substantially vertical or oblique direction with regard to the direction of the length of the middle portion of the mask sheet and further configured to press the mask sheet in a direction substantially parallel and then oblique to the direction of the length of the middle portion of the mask sheet so as to support the mask sheet.

2. The mask tensioning apparatus of claim 1, wherein the clamps are configured to clamp the first and second ends of the mask sheet.

3. The mask tensioning apparatus of claim 2, wherein each of the first and second ends of the mask sheet comprises a pair of ends, and wherein the four ends are formed at four edges of the mask sheet.

4. The mask tensioning apparatus of claim 1, wherein the tensioners are configured to further apply the tensioning force to the mask sheet in the substantially vertical or oblique direction.

5. The mask tensioning apparatus of claim 1, further comprising a pressing member configured to press the mask sheet in a side of the mask frame in a direction substantially perpendicular to the direction of the length of the middle portion of the mask sheet.

6. The mask tensioning apparatus of claim 5, wherein the pressing member is formed as a pair to press both end portions of the middle portion of the mask sheet.

7. The mask tensioning apparatus of claim 6, wherein the pressing member includes a polygonal block or a roller.

8. A mask sheet for manufacturing an organic light emitting diode (OLED) display as a mask sheet weld-coupled on a mask frame for the OLED display, the mask sheet comprising
   a body portion having a plurality of openings configured to pass through an organic material to form a thin film pattern on a substrate, wherein the body portion has a length and a width less than the length; and
   side portions formed on opposing ends of the body portion and substantially vertical extending from the body portion, wherein the side portions are configured to be pressed by a clamp in a direction substantially parallel and then oblique to the direction of the length of the body portion so as to support the mask sheet.

9. The mask sheet of claim 8, wherein the side portions are formed at four edges of the mask sheet.

10. A mask manufacturing system comprising:
    a mask frame;
    a mask sheet placed on the mask frame;
    a mask tensioning apparatus including i) at least two clamps configured to support the mask sheet to fix the mask sheet to the mask frame, wherein the mask sheet has i) a linear middle portion and ii) first and second ends opposing each other and extending from the middle portion at an angle and ii) at least two tensioners configure to apply a tensioning force to the clamps to fix the mask sheet and apply the tensioning force to the mask sheet in the length direction of the mask sheet, each tensioner connecting to each clamp, wherein the mask sheet has a length and a width less than the length; and a coupler configured to couple the mask sheet to the mask frame, wherein the clamps are arranged in a substantially vertical or oblique direction with regard to the direction of the length of the middle portion of the mask sheet and further configured to press the mask sheet in a direction substantially parallel and then oblique to the direction of the length of the middle portion the mask sheet so as to support the mask sheet.

11. The mask manufacturing system of claim 10, wherein the clamps are configured to clamp the first and second ends of the mask sheet.

12. The mask manufacturing system of claim 11, wherein each of the first and second ends of the mask sheet comprises a pair of ends, and wherein the four ends are formed at four edges of the mask sheet.

13. The mask manufacturing system of claim 10, wherein the tensioners are configured to further apply the tensioning force to the mask sheet in the substantially vertical or oblique direction.

14. The mask manufacturing system of claim 10, further comprising a pressing member configured to press the mask sheet in a side of the mask frame in a direction substantially perpendicular to the direction of the length of the middle portion of the mask sheet.

15. The mask manufacturing system of claim 14, wherein the pressing member is formed as a pair to press both end portions of the middle portion of the mask sheet.

16. The mask manufacturing system of claim 15, wherein the pressing member includes a polygonal block or a roller.

17. The mask manufacturing system of claim 10, wherein the mask frame includes:

a pair of first frames substantially parallel with each other, and a plurality of second frames coupled to the first frames in a direction substantially perpendicular to the first frames and arranged to be separated from each other.

18. The mask manufacturing system of claim 17, wherein a plurality of mask sheets are coupled to one opening formed by a pair of first frames and two adjacent second frames of the mask frame.

19. The mask manufacturing system of claim 10, wherein the coupler is a welding apparatus configured to weld the mask sheet to the mask frame.

* * * * *